United States Patent
Zang et al.

(10) Patent No.: US 10,636,893 B2
(45) Date of Patent: Apr. 28, 2020

(54) REPLACEMENT METAL GATE WITH REDUCED SHORTING AND UNIFORM CHAMFERING

(71) Applicant: GLOBALFOUNDRIES INC., Grand Cayman (KY)

(72) Inventors: Hui Zang, Guilderland, NY (US); Guowei Xu, Ballston Lake, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/108,753

(22) Filed: Aug. 22, 2018

(65) Prior Publication Data
US 2020/0066879 A1    Feb. 27, 2020

(51) Int. Cl.
  *H01L 29/66* (2006.01)
  *H01L 21/8238* (2006.01)
  *H01L 29/10* (2006.01)
  *H01L 21/8234* (2006.01)
  *H01L 29/78* (2006.01)

(52) U.S. Cl.
  CPC .. *H01L 29/66545* (2013.01); *H01L 21/82345* (2013.01); *H01L 21/823431* (2013.01); *H01L 21/823842* (2013.01); *H01L 29/1054* (2013.01); *H01L 29/66795* (2013.01); *H01L 29/7848* (2013.01)

(58) Field of Classification Search
  CPC .................................................. H01L 29/6653
  See application file for complete search history.

(56) References Cited

U.S. PATENT DOCUMENTS

| | | | |
|---|---|---|---|
| 8,809,139 B2 | 8/2014 | Huang et al. | |
| 10,367,061 B1* | 7/2019 | Loubet | |
| 2011/0147831 A1 | 6/2011 | Steigerwald et al. | |
| 2011/0248348 A1 | 10/2011 | Gan et al. | |
| 2013/0187236 A1 | 7/2013 | Xie et al. | |
| 2016/0042954 A1* | 2/2016 | Sung | H01L 21/32139 257/407 |
| 2018/0047754 A1* | 2/2018 | Basker | H01L 21/823431 |

* cited by examiner

*Primary Examiner* — Peniel M Gumedzoe
*Assistant Examiner* — Christopher A Johnson
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to replacement metal gate structures with reduced shorting and uniform chamfering, and methods of manufacture. The structure includes: a long channel device composed of a conductive gate material with a capping layer over the conductive gate material and extending to sides of the conductive gate material; and a short channel device composed of the conductive gate material and the capping layer over the conductive gate material.

16 Claims, 5 Drawing Sheets

REPLACEMENT METAL GATE WITH REDUCED SHORTING AND UNIFORM CHAMFERING

FIELD OF THE INVENTION

The present disclosure relates to semiconductor structures and, more particularly, to replacement metal gate structures with reduced shorting and uniform chamfering, and methods of manufacture.

BACKGROUND

In FinFET technologies, shorting of trench silicide to the metal gate material is becoming a yield issue due to the contact trench silicide spacing design. In addition, for long channel devices and short channel devices, workfunction chamfering also becomes problematic due to different etching rates within the differently sized spacing for these devices. In fact, long channel devices with a different gate length also shows chamfering difference.

The chamfering issue also contributes to metal gate height non-uniformity for device macros with different Lg, which causes the final metal gate height non-uniformity issue post contact recess. This problem also appears to contribute to metal gate to source/drain contact shorting issues.

SUMMARY

In an aspect of the disclosure, a structure comprises: a long channel device composed of a conductive gate material with a capping layer over the conductive gate material and extending to sides of the conductive gate material; and a short channel device composed of the conductive gate material and the capping layer over the conductive gate material.

In an aspect of the disclosure, a structure comprises: a first gate structure having a first gate length, the first gate structure comprising: a spacer material; a workfunction metal over the spacer material; a conductive gate material over the workfunction metal; and a capping material in a "C" shape extending over the conductive gate material and on sides of the conductive gate material; and a second gate structure having a second gate length shorter than the first gate length, the second gate structure comprising: the spacer material; the workfunction metal over the spacer material; the conductive gate material over the workfunction metal; and the capping material over a top surface of the conductive gate material, the spacer material and separated from the workfunction metal.

In an aspect of the disclosure, a method comprises: forming a long channel device composed of a conductive gate material with a capping material over the conductive gate material and extending to sides of the conductive gate material; and forming a short channel device composed of the conductive gate material and the capping layer over the conductive gate material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to replacement metal gate structures with reduced shorting and uniform chamfering, and methods of manufacture. More specifically, the present disclosure is directed to a replacement metal gate process that reduces shorts and provides chamfering uniformity in the trenches of the replacement gate structures (e.g., prevents chamfering of workfunction metal within both long channel gate devices and short channel gate devices).

The replacement metal gate structures of the present disclosure can be manufactured in a number of ways using a number of different tools. In general, though, the methodologies and tools are used to form structures with dimensions in the micrometer and nanometer scale. The methodologies, i.e., technologies, employed to manufacture the replacement metal gate structures of the present disclosure have been adopted from integrated circuit (IC) technology. For example, the structures are built on wafers and are realized in films of material patterned by photolithographic processes on the top of a wafer. In particular, the fabrication of the replacement metal gate structures use three basic building blocks: (i) deposition of thin films of material on a substrate, (ii) applying a patterned mask on top of the films by photolithographic imaging, and (iii) etching the films selectively to the mask.

Figure 1:
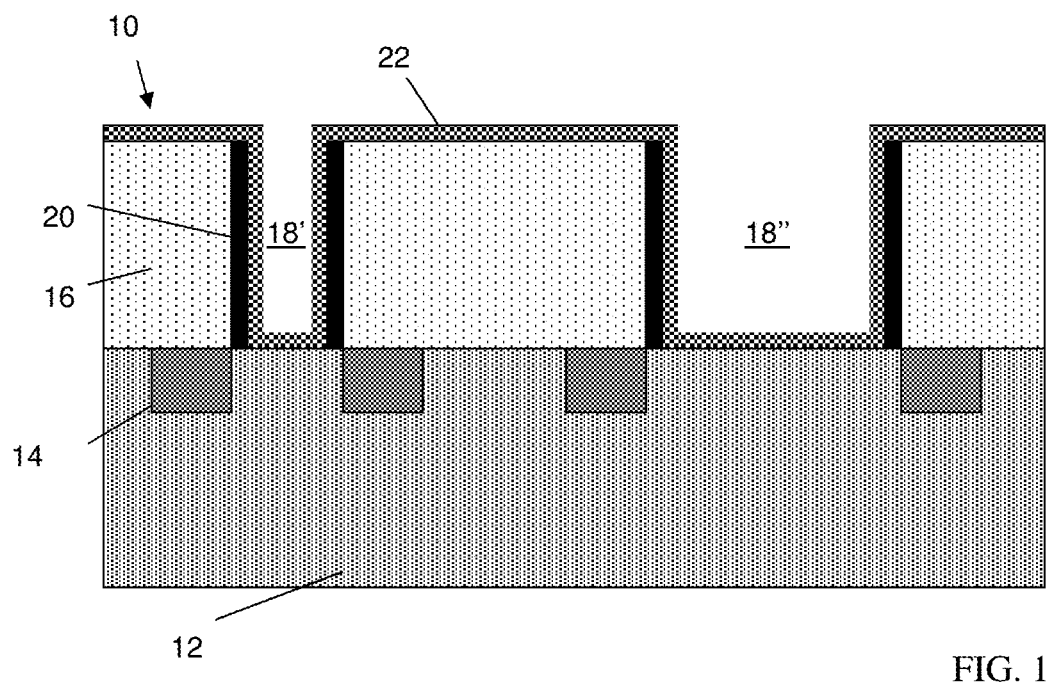
FIG. 1 shows a structure with trenches formed by removal of dummy gate structures, amongst other features, and respective fabrication processes in accordance with aspects of the present disclosure.

FIG. 1 shows a structure with trenches formed by removal of dummy gate structures, amongst other features, and respective fabrication processes in accordance with aspects of the present disclosure. More specifically, the structure 10 includes a substrate 12 composed of semiconductor material. In embodiments, the substrate 12 can be composed of any suitable material including, but not limited to, Si, SiGe, SiGeC, SiC, GaAs, InAs, InP, and other III/V or II/VI compound semiconductors. Diffusion regions 14 are provided in or on the substrate 12. In embodiments, the diffusion regions 14 are source and drain regions which can be fabricated using any appropriate diffusion processes. For example, the diffusions 14 can be formed by ion implantation processes or other doping processes known to those of skill in the art. In embodiments, the diffusion regions 14 can be raised source and drain regions formed by a doped epitaxial growth process of semiconductor material.

Still referring to FIG. 1, a dielectric material 16 is deposited on the substrate 12 and over the diffusion regions 14. In embodiments, the dielectric material 16 can be an oxide material or other known interlevel dielectric material. Trenches 18', 18" are formed in the dielectric material 16. In embodiments, the trenches 18', 18" can be of different dimensions, e.g., widths, for a short channel device (e.g., trench 18') and a long channel device (e.g., trench 18"). In embodiments, the trenches 18', 18" are lined with a liner material 20, e.g., low-k dielectric material.

To form the trenches 18', 18", for example, a dummy gate material is deposited and patterned on the substrate 12 using conventional deposition, lithography and etching processes known to those of skill in the art. The liner material 20 is then deposited on the patterned dummy gate material, followed by an anisotropic etching process to remove the liner material 20 from horizontal surfaces, e.g., on a top of the substrate 12 and the patterned dummy gate material. The dielectric material 16 is then deposited on the patterned dummy gate material and the liner material 20, followed by a chemical mechanical polishing process. The patterned dummy gate material is then removed by a selective etching process to form the trenches 18', 18", already lined with the liner material 20.

FIG. 1 further shows a workfunction material 22 deposited within the trenches 18', 18" and over the liner material 20. In embodiments, the workfunction material 22 is a workfunction metal such as, e.g., TaN, TiAlC or TiN. In embodiments, the workfunction material 22 can be deposited by any conventional deposition processes, e.g., chemical vapor deposition (CVD) or atomic layer deposition (ALD) processes. In preferred embodiments, the thickness of the workfunction material 22 is less than half (½) the width of the trench 18' for the short channel device. In embodiments, prior to the deposition of the workfunction material 22, a gate dielectric material can be deposited on the substrate 12, which would be under the workfunction material 22. The gate dielectric material can be a high-k gate dielectric material, e.g., $HfO_2Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

Figure 2:
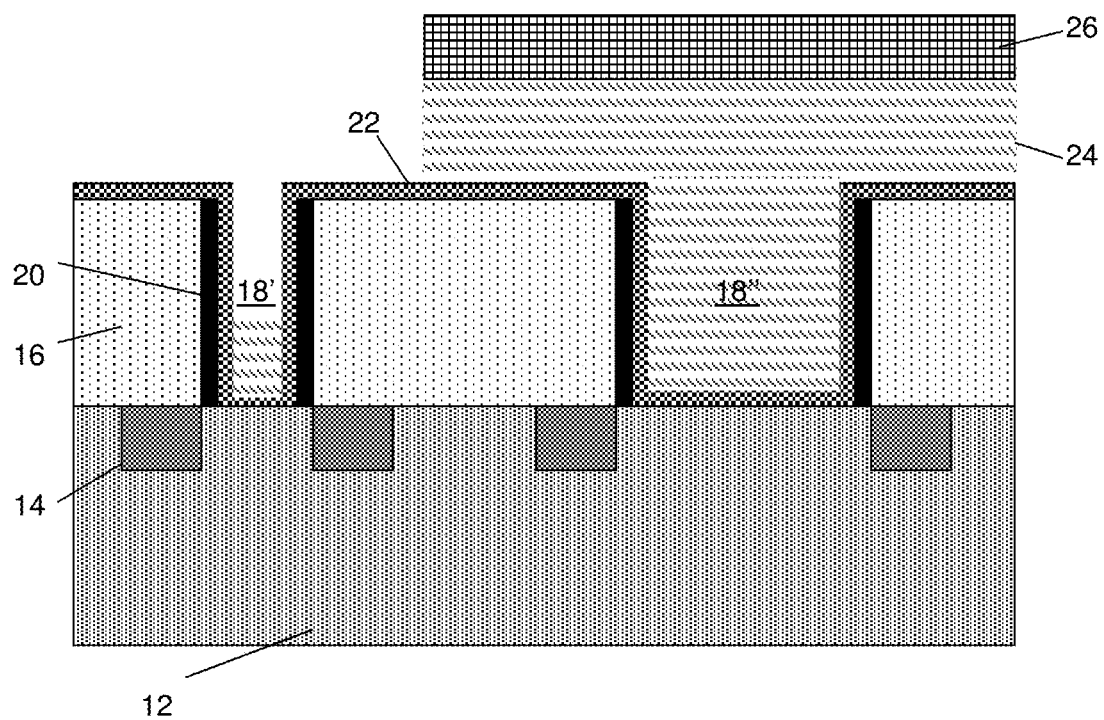
FIG. 2 shows a material within the trenches, amongst other features, and respective fabrication processes in accordance with aspects of the present disclosure.

In FIG. 2, an organic planarizing layer (OPL) material 24 is deposited within the trenches 18',18". A portion of the OPL material 24 is removed from the trench 18' by conventional lithography and etching processes. For example, a resist 26 formed over the OPL material 24 is exposed to energy (light) to form a pattern (opening) over the trench 18' (and adjacent areas over the dielectric material 16 which define the short channel region). An etching process with a selective chemistry, e.g., reactive ion etching (RIE), will be used to remove portions of the OPL material 24 within the trench 18' and over any exposed regions of the dielectric material 16. In embodiments, the OPL material 24 will not be completely removed within the trench 18'. For example, the OPL material 24 can will fill the trench 18' to about 15%-30% of its height.

Figure 3:
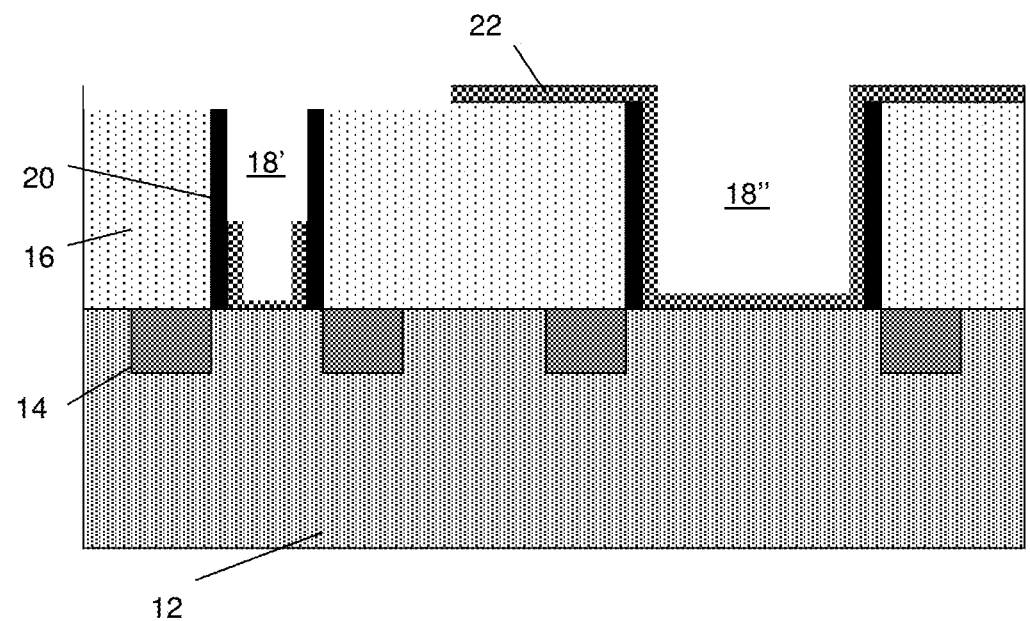
FIG. 3 shows a workfunction metal lining the trenches, amongst other features, and respective fabrication processes in accordance with aspects of the present disclosure.

As shown in FIG. 3, the resist is removed by a conventional oxygen ashing process or other known stripants. Following the resist removal, the remaining portions of the OPL material 24 can be removed by a selective etching process. In this way, the workfunction material 22 will remain within the trench 18" and partially within the trench 18', exposing the liner material 20. Accordingly, in embodiments, the workfunction material 22 partially lines the trench 18' of the short channel device to at a height of about 20 nm to about 25 nm; although other heights are also contemplated herein.

The processes of FIGS. 2 and 3 ensure that all of the OPL is removed from the trenches 18', 18" for both the short channel device and the long channel device, respectively. In this way, subsequent processing steps will not result in chamfering of workfunction metal within both long channel gate devices and short channel gate devices; instead, the workfunction metal within both the trenches 18', 18" will remain uniform.

Figure 4:
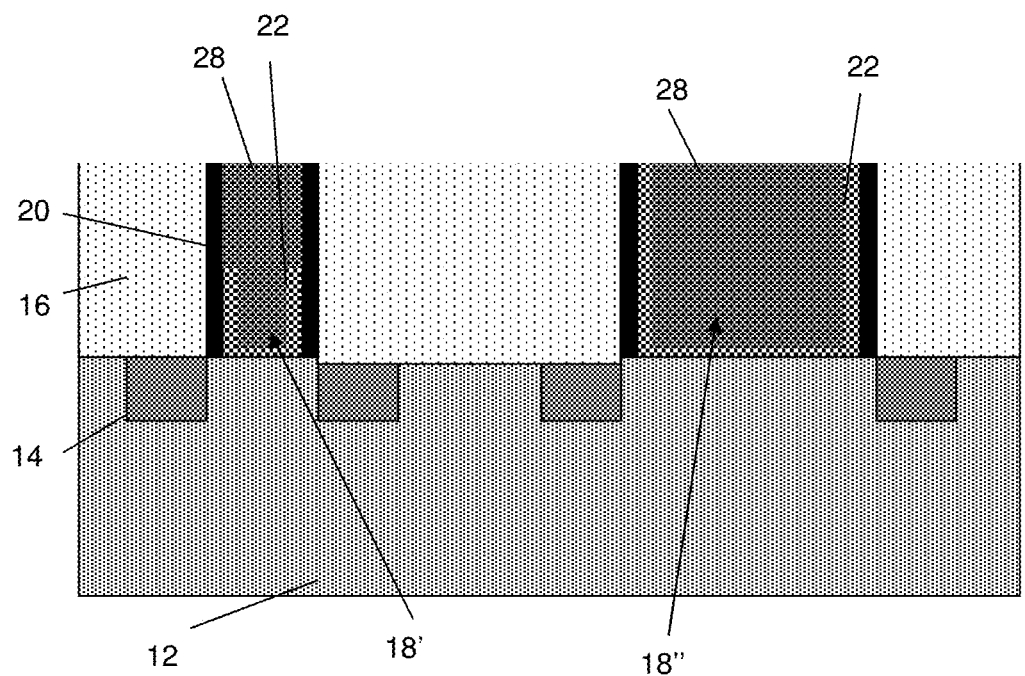
FIG. 4 shows conductive gate material over the workfunction metal, amongst other features, and respective fabrication processes in accordance with aspects of the present disclosure.

As shown in FIG. 4, a conductive gate material 28 is deposited within the trenches 18', 18". In embodiments, the conductive gate material 28 is fluorine-free tungsten material. In embodiments, the conductive gate material 28 can be deposited by a conventional deposition process, e.g., CVD, followed by a chemical mechanical planarization (CMP) process. The CMP process will also remove any workfunction material 22 on the dielectric material 16. Similarly, in this way, subsequent processing steps will not result in chamfering of workfunction metal within both long channel gate devices and short channel gate devices; instead, the workfunction metal within both the trenches 18', 18" remain uniform.

Figure 5:
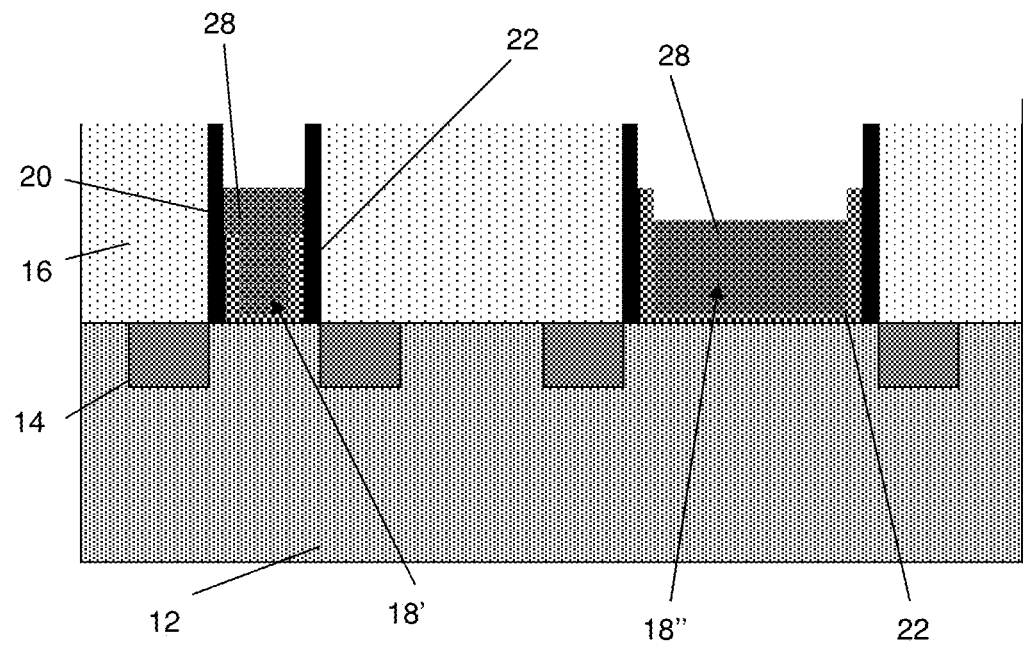
FIG. 5 shows the conductive gate material recessed within the trenches, amongst other features, and respective fabrication processes in accordance with aspects of the present disclosure.

In FIG. 5, the conductive gate material 28 is recessed within both the trenches 18', 18". In embodiments, as there is no chamfering issues, the metal gate height can be uniform for device macros with different Lg (e.g., gate lengths). This uniformity would also prevent to metal gate to source/drain contact shorting issues.

As shown in this illustration, for example, the conductive gate material 28 will protect the workfunction material 22 from being eroded or recessed within the trench 18' during this process. On the other hand, however, the workfunction material 22 which is exposed in the trench 18" which forms the long channel device will be subjected to the recessing process. As the workfunction material 22 and the conductive material 28 have different etch rates, the conductive material 28 will be recessed to below a surface of the workfunction material 22.

Figure 6:
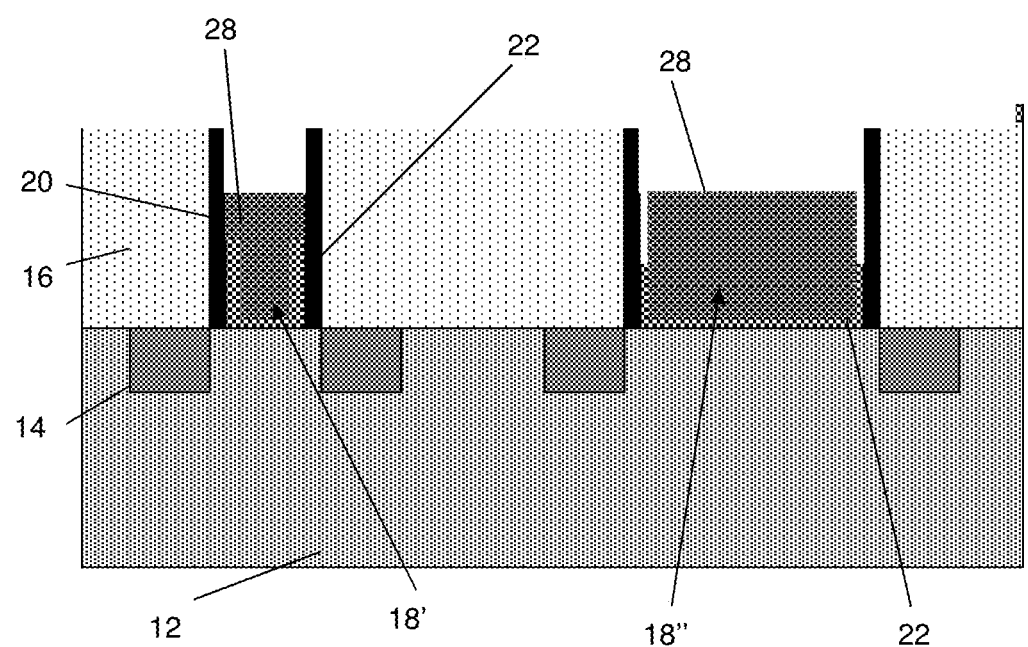
FIG. 6 shows the workfunction metal recessed below the conductive gate material recessed within one of the trenches, amongst other features, and respective fabrication processes in accordance with aspects of the present disclosure.

In FIG. 6, the exposed workfunction material 22 in the trench 18" for the long channel device will be subjected to a further recessing process, e.g., etching process. For example, through a highly selective etch chemistry, the exposed workfunction material 22 can be recessed to below a surface of the conductive material 28. The highly selective etch chemistry will not attack the conductive material 28. Accordingly, the conductive material 28 in the trench 18' for the short channel device will protect the workfunction material 22 from being recessed during this process. In embodiments, the workfunction material 22 in the trench 18" can be recessed about 50% the height of the conductive material 28. In a more specific embodiment, the workfunction material 22 can be recessed about 5 nm to about 20 nm.

Figure 7:
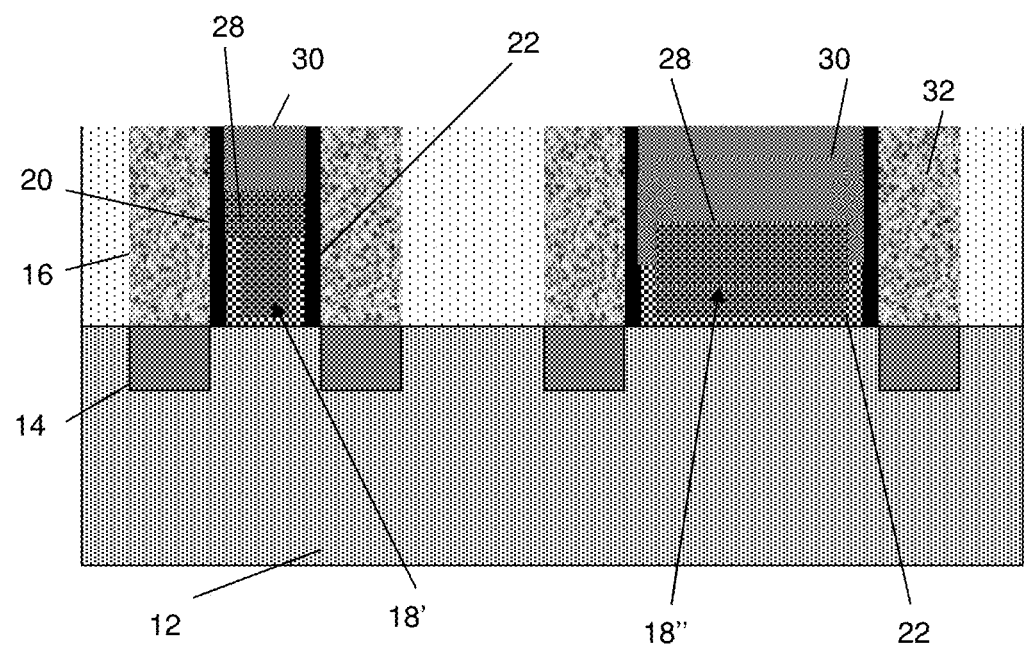
FIG. 7 shows source/drain contacts and capping material on the conductive gate material, amongst other features, and respective fabrication processes in accordance with aspects of the present disclosure.

As shown in FIG. 7, a capping material 30 is deposited within the trenches 18', 18". In embodiments, the capping material 30 can be a nitride material which is deposited by a CVD process. In the trench 18", the capping material 30 is provided within the recesses formed by the additional etching of the workfunction material 22, thereby forming a "C" shaped cap; whereas, the capping material 30 in the trench 18' is a conventional table shape. Following the deposition process, any residual material on the surface of the dielectric material 16 can be removed by a CMP process.

FIG. 7 also shows contacts 32 in electric contact with the source and drain regions (e.g., diffusions 14). In embodiments, the contacts 32 are formed by an etching process to expose the source and drain regions 14, followed by a deposition of metal material. In embodiments, the metal material can include a TiN (or Ti) liner and a tungsten or cobalt fill material; although other metals can also be deposited over the liner. After the deposition of the metal material, any residual material on the surface of the dielectric material 16 should be removed by a CMP process.

Prior to the contact formation, the source and drain regions 14 can undergo a silicide process. As should be understood by those of skill in the art, the silicide process begins with deposition of a thin transition metal layer, e.g., nickel, cobalt or titanium, over fully formed and patterned semiconductor devices (e.g., doped or ion implanted source and drain regions. After deposition of the material, the structure is heated allowing the transition metal to react with exposed silicon (or other semiconductor material as described herein) in the active regions of the semiconductor device (e.g., source and drain regions) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

Figure 8:
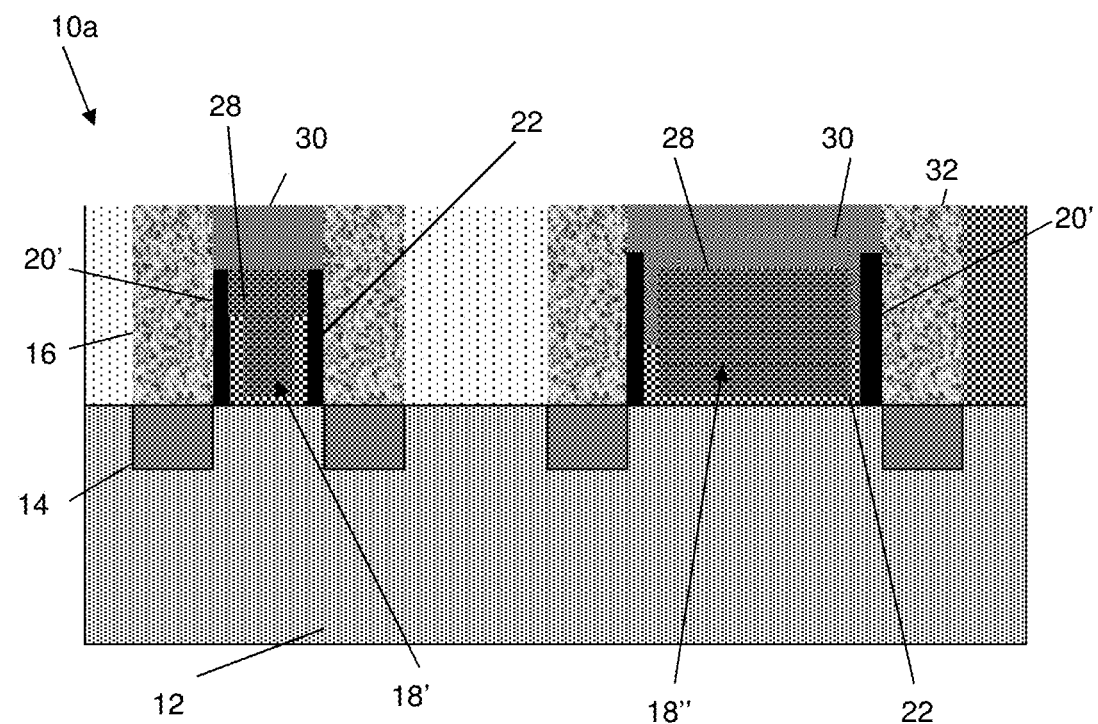
FIG. 8 shows an alternative replacement metal gate structure and respective fabrication processes in accordance with aspects of the present disclosure.

FIG. 8 shows an alternative replacement metal gate structure and respective fabrication processes in accordance with aspects of the present disclosure. In the structure 10a of FIG. 8, the liner material 20', e.g., low-k dielectric material, in each of the trenches 18', 18" is also slightly recessed. The recess of the liner material 20' can be performed after the recessing of the workfunction material 22, for example, shown in FIG. 6. In embodiments, the recessing of the liner material 20', e.g., low-k dielectric material, in each of the trenches 18', 18" can be performed by a timed etching process using a highly selective etch chemistry that will not attack the conductive gate material 28 or the workfunction material 22. In the trench 18", the liner material 20' is recessed to above the workfunction material 22 and the conductive gate material 28, e.g., anywhere between a top surface of the trench 18" and a top surface of the conductive gate material 28. In the trench 18', the liner material 20' is recessed to above the conductive gate material 28. The remaining processes continue as shown in FIG. 7, for example.

Figure 9:
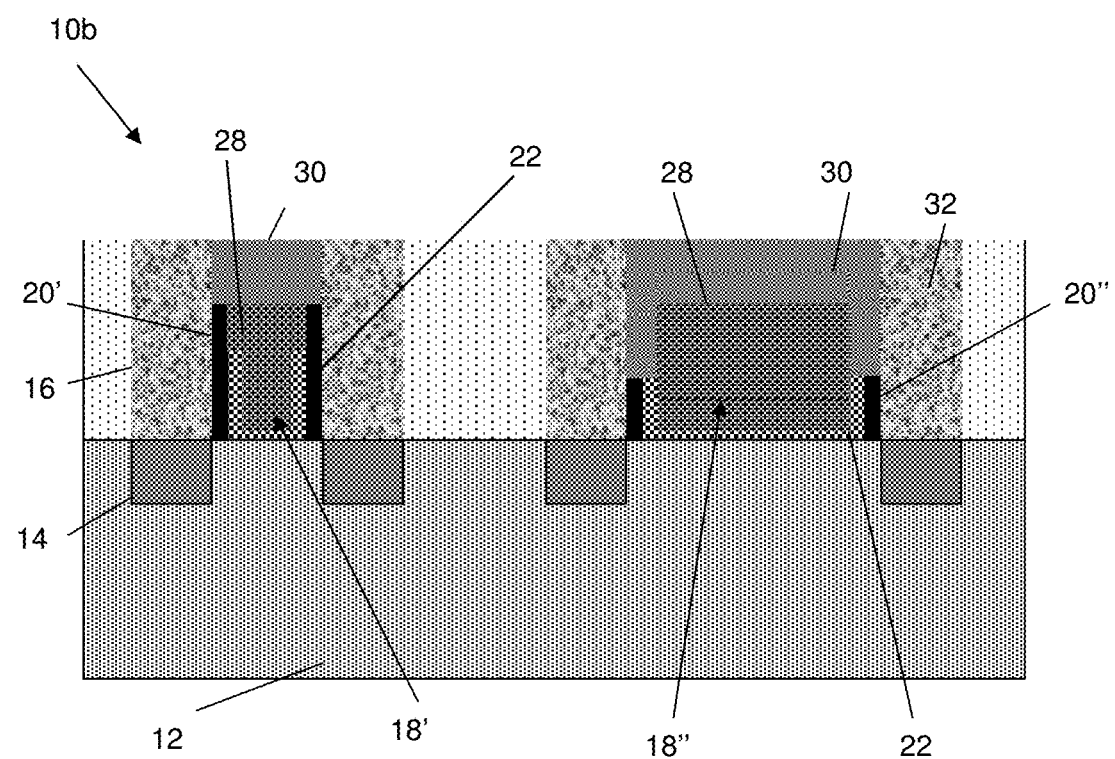
FIG. 9 shows another alternative replacement metal gate structure and respective fabrication processes in accordance with aspects of the present disclosure.

FIG. 9 shows an alternative replacement metal gate structure and respective fabrication processes in accordance with aspects of the present disclosure. In the structure 10b of FIG. 9, the liner material 20', e.g., low-k dielectric material, in the trench 18' is slightly recessed; whereas, the liner material 20", e.g., low-k dielectric material, in the trench 18" is recessed to a same height as the workfunction material 22. The recessing of the liner materials 20', 20" can be performed after the recess process of the workfunction material 22 shown, for example, in FIG. 6. In embodiments, the recessing of the liner material 20', e.g., low-k dielectric material, in each of the trenches 18', 18" can be recessed by a timed highly selective etch chemistry that will not attack the conductive gate material 28 or the workfunction material 22. In embodiments, the liner material 20' is recessed to below the conductive gate material 28 in the trench 18", e.g., anywhere between a top surface of the trench 18" and a top surface of the conductive gate material 28. In the trench 18', the liner material 20' is recessed to above the conductive gate material 28. The remaining processes continue as shown in FIG. 7, for example.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a long channel device composed of a conductive gate material with a capping material over the conductive gate material and extending to sides of the conductive gate material; and
   a short channel device composed of the conductive gate material and the capping layer over the conductive gate material,
   wherein the capping material extending on the sides of the conductive gate material is between the conductive gate material and spacer material adjacent to a source contact or drain contact, and the conductive gate material of the long channel device and the short channel device are at a same height.

2. The structure of claim 1, wherein the capping material of the long channel device is a "C" shape.

3. The structure of claim 1, wherein the spacer material is a low-k dielectric material.

4. The structure of claim 1, wherein the conductive gate material of the long channel device is over a recessed workfunction material.

5. The structure of claim 4, wherein the workfunction metal of the long channel device is below an upper surface of the conductive gate material.

6. The structure of claim 5, wherein the spacer material of the long channel device is recessed to a same height as the workfunction metal of the long channel device.

7. A structure comprising:
   a long channel device composed of a conductive gate material with a capping material over the conductive gate material and extending to sides of the conductive gate material; and a short channel device composed of the conductive gate material and the capping layer over the conductive gate material, wherein the capping material extending on the sides of the conductive gate material is between the conductive gate material and spacer material adjacent to a source contact or drain contact, wherein the conductive gate material of the long channel device is over a recessed workfunction material, wherein the workfunction metal of the long channel device is below an upper surface of the conductive gate material, and wherein the spacer material is recessed to below an upper surface of the capping material and above a height of the conductive gate material of the long channel device.

8. The structure of claim 7, wherein the capping material of the long channel device contacts the source contact or the drain contact of the long channel device.

9. A structure, comprising:
a first gate structure having a first gate length, the first gate structure comprising:
a spacer material;
a workfunction metal over the spacer material;
a conductive gate material over the workfunction metal; and
a capping material in a "C" shape extending over the conductive gate material and on sides of the conductive gate material; and
a second gate structure having a second gate length shorter than the first gate length, the second gate structure comprising:
the spacer material;
the workfunction metal over the spacer material;
the conductive gate material over the workfunction metal; and
the capping material over a top surface of the conductive gate material, the spacer material and separated from the workfunction metal, and
wherein the conductive gate material for both the first gate structure and the second gate structure are at a same height.

10. The structure of claim 9, wherein the first gate structure is a long channel device and the second gate structure is a short channel device.

11. The structure of claim 9, wherein legs of the "C" shaped capping material extending on the sides of the conductive gate material of the first gate structure are between the conductive gate material and the spacer material.

12. The structure of claim 9, wherein the spacer material for both the first gate structure and the second gate structure is a low-k dielectric material.

13. The structure of claim 9, wherein the workfunction metal of the first gate structure is recessed to below a surface of the conductive gate material of the first gate structure.

14. The structure of claim 9, wherein the spacer material of the first gate structure is recessed to a same height as the workfunction metal of the first gate structure.

15. The structure of claim 14, wherein the spacer material of the first gate structure is recessed to below an upper surface of the "C" shaped capping material and above a height of the conductive gate material of the first gate structure.

16. The structure of claim 15, wherein the capping material of the first gate structure contacts to source/drain contacts.

* * * * *